(12) United States Patent
Munakata et al.

(10) Patent No.: US 11,933,857 B2
(45) Date of Patent: Mar. 19, 2024

(54) BATTERY RESIDUAL VALUE DETERMINATION SYSTEM

(71) Applicant: Toyo System Co., Ltd., Fukushima (JP)

(72) Inventors: Ichiro Munakata, Fukushima (JP); Toshiaki Kanari, Fukushima (JP); Masahiro Shoji, Fukushima (JP); Katsunari Matsumoto, Fukushima (JP); Ryo Ishigami, Fukushima (JP); Takanori Anrui, Fukushima (JP); Misaki Shimoyamada, Fukushima (JP); Hideki Shoji, Fukushima (JP)

(73) Assignee: TOYO SYSTEM CO., LTD., Fukushima (JP)

( * ) Notice: Subject to any disclaimer, the term of this patent is extended or adjusted under 35 U.S.C. 154(b) by 110 days.

(21) Appl. No.: 17/600,675

(22) PCT Filed: Jan. 29, 2020

(86) PCT No.: PCT/JP2020/003273
§ 371 (c)(1),
(2) Date: Oct. 1, 2021

(87) PCT Pub. No.: WO2020/202752
PCT Pub. Date: Oct. 8, 2020

(65) Prior Publication Data
US 2022/0163597 A1 May 26, 2022

(30) Foreign Application Priority Data
Apr. 2, 2019 (JP) ................. 2019-070854

(51) Int. Cl.
*G01R 31/392* (2019.01)
*B60L 58/12* (2019.01)
*B60L 58/16* (2019.01)
*H01M 10/48* (2006.01)

(52) U.S. Cl.
CPC ........... *G01R 31/392* (2019.01); *B60L 58/12* (2019.02); *B60L 58/16* (2019.02); *H01M 10/48* (2013.01)

(58) Field of Classification Search
None
See application file for complete search history.

(56) References Cited

U.S. PATENT DOCUMENTS 9,625,532 B2    4/2017  Gering
2013/0110429 A1  5/2013  Mitsuyama et al.
(Continued)

FOREIGN PATENT DOCUMENTS

JP    2006197765 A    7/2006
JP    2009002691 A    1/2009
(Continued)

OTHER PUBLICATIONS

International Search Report re PCT/JP2020/003273 dated Mar. 3, 2020 (4 pages).
(Continued)

*Primary Examiner* — Jas A Sanghera
(74) *Attorney, Agent, or Firm* — Holtz, Holtz & Volek PC

(57) ABSTRACT

Provided is a battery residual value determination system capable of easily and accurately determining the residual value of a battery. The battery residual value determination system includes: a battery information reception unit that receives information on the voltage, the current, the temperature, and the period of time elapsed from the time of manufacture of a battery; a first residual value determination unit that determines a first residual value indicating the SOH of the battery; an attenuation function determination unit that determines an attenuation function which indicates a time-dependent change of the SOH specific to the battery and is used for correcting the first residual value of the (Continued)

battery; and a second residual value output unit that determines and outputs a second residual value obtained by correcting the first residual value by using the attenuation function according to the period of time elapsed from the time of manufacture of the battery.

2 Claims, 4 Drawing Sheets

(56) References Cited

U.S. PATENT DOCUMENTS

2015/0301122 A1* 10/2015 Lee .................. G01R 31/392
                                                  702/63
2016/0054392 A1*  2/2016 Lee .................. H01M 10/48
                                                  702/63
2016/0285136 A1   9/2016 Abe
2019/0317155 A1  10/2019 Inoue et al.

FOREIGN PATENT DOCUMENTS

| JP | 2011091026 A | 5/2011 |
|---|---|---|
| JP | 2015021934 A | 2/2015 |
| JP | 2016178052 A | 10/2016 |
| WO | 2013014930 A1 | 1/2013 |
| WO | 2016194082 A1 | 12/2016 |
| WO | 2018117105 A1 | 6/2018 |

OTHER PUBLICATIONS

European Office Action dated Sep. 2, 2022, issued in counterpart European Application No. 20781296.7.

Japanese Office Action (and an English language translation thereof) dated Feb. 12, 2020, issued in counterpart Japanese Application No. 2019-070854.

* cited by examiner

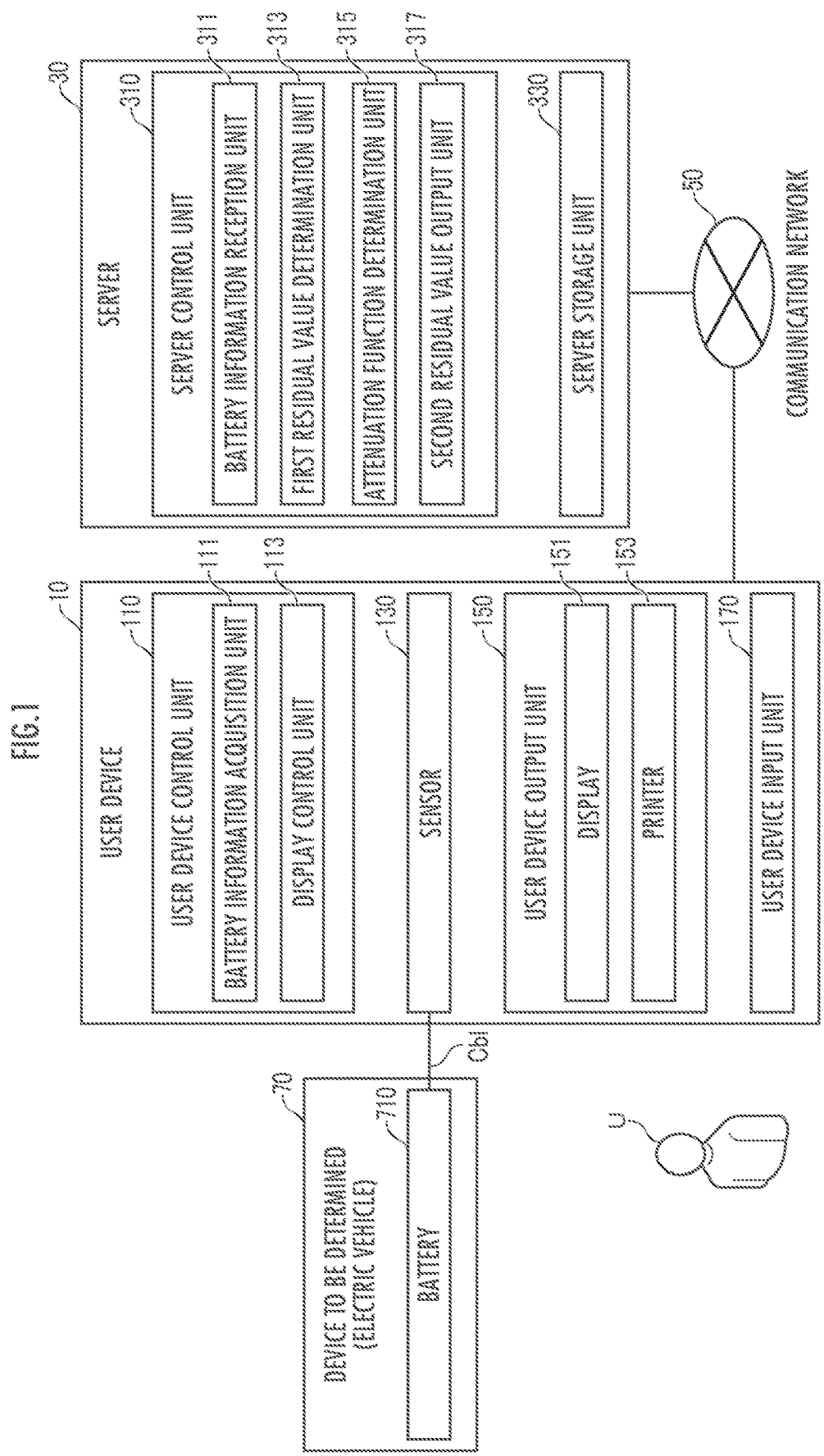

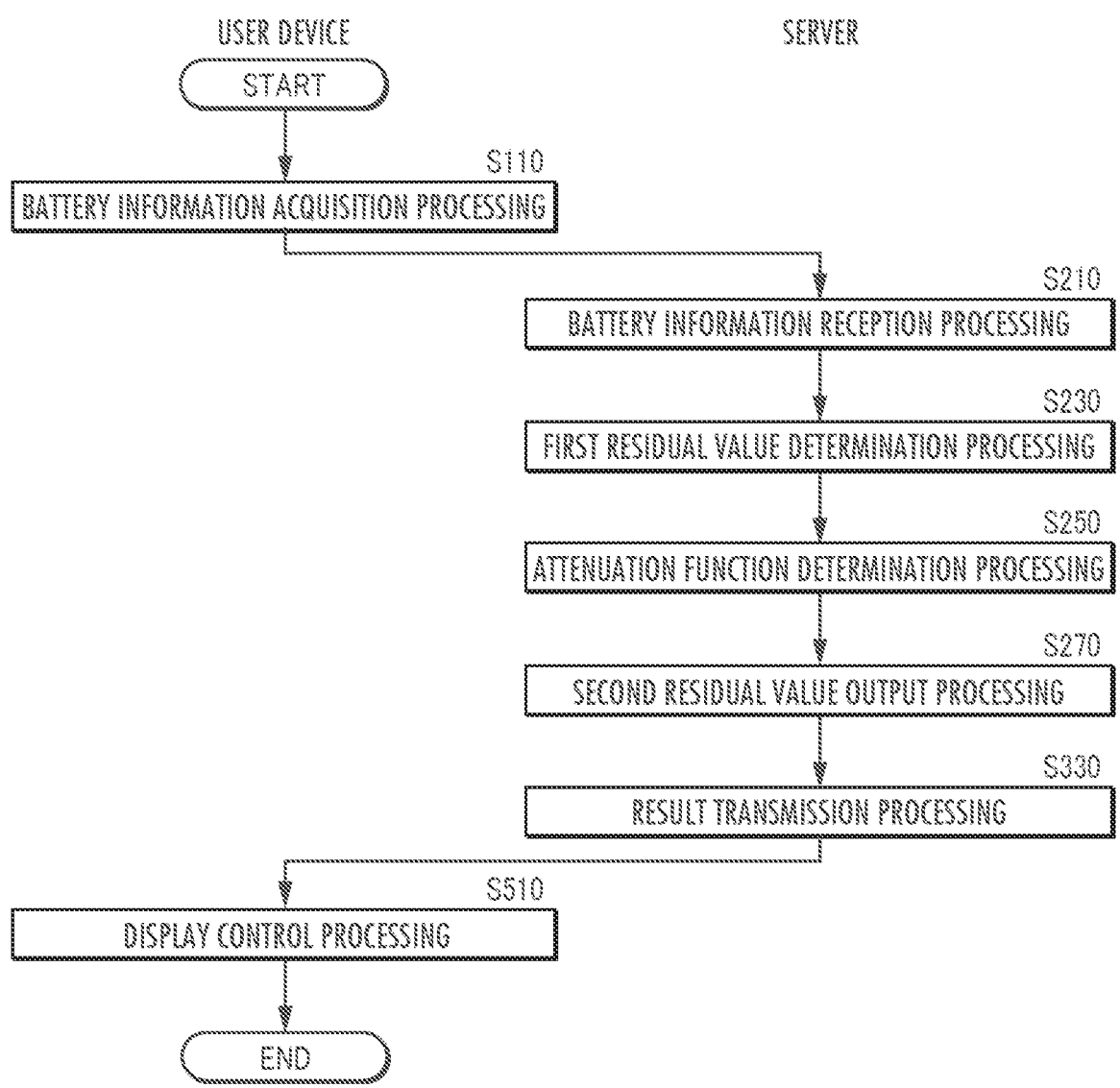

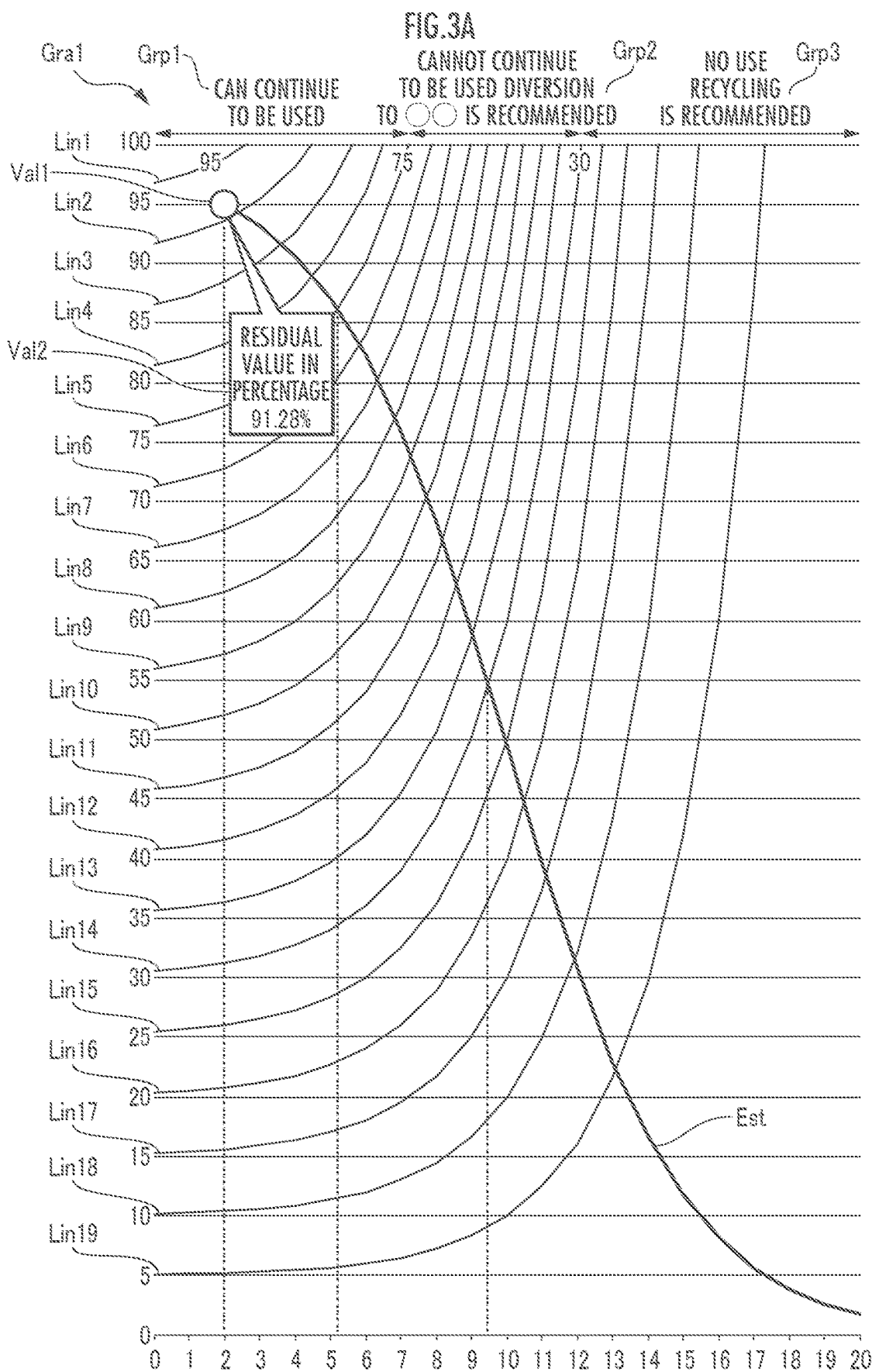

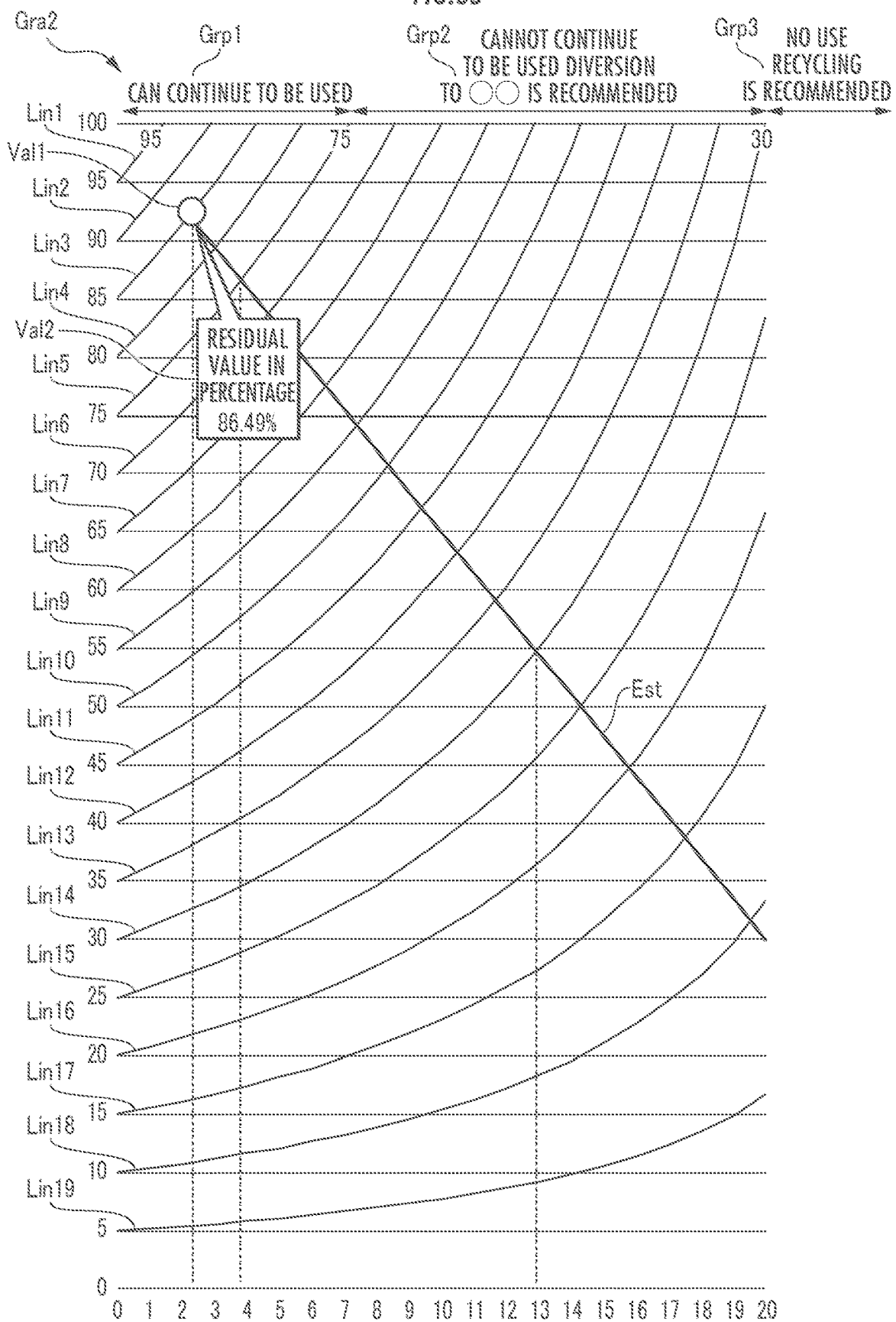

BATTERY RESIDUAL VALUE DETERMINATION SYSTEM

CROSS-REFERENCE TO RELATED APPLICATIONS

This patent application is a U.S. National Stage filing of, and claims priority to and all advantages of, PCT Patent Publication Number PCT/JP2020/003273 filed on Jan. 29, 2020 and Japanese Patent Application No. 2019-070854 filed on Apr. 2, 2019, the contents of both of which are incorporated herein by reference in their entireties.

TECHNICAL FIELD

The present invention relates to a system that determines the residual value of a battery.

BACKGROUND ART

Hitherto, there has been known a system adapted to determine the residual value of an electric vehicle or a hybrid vehicle (refer to Patent Literature 1).

According to the system in Patent Document 1, the residual value of a secondary battery based on battery deterioration parameters can be determined thereby to determine the residual value of an electric vehicle or a hybrid vehicle.

CITATION LIST

Patent Literature

Patent Literature 1: Japanese Patent Application Laid-Open No. 2006-197765

SUMMARY OF INVENTION

Technical Problem

The residual value of a drive battery is an important factor in determining the residual value of an electric vehicle or a hybrid vehicle, so that users of a system such as the one in Patent Document 1 have a high need to know the exact residual value of a battery.

However, although the system in Patent Document 1 is said to determine the residual value of a secondary battery on the basis of degradation parameters, it is not clear how to determine the residual value of a secondary battery on the basis of these degradation parameters.

Consequently, the system in Patent Document 1 cannot meet the needs of users who want to know the exact residual value of a battery in order to determine the residual value of an electric vehicle or a hybrid vehicle.

In view of the problems of the prior art described above, an object of the present invention is to provide a battery residual value determination system capable of easily and accurately determining the residual value of a battery.

Solution to Problem

A battery residual value determination system in accordance with the present invention includes:

a battery information reception unit that receives information on a voltage, a current, a temperature, and a period of time elapsed from the time of manufacture of a battery for which a residual value is to be determined;

a first residual value determination unit that determines a first residual value indicating a SOH (State of Health) of the battery on the basis of the information on the voltage, the current, and the temperature of the battery received by the battery information reception unit;

an attenuation function determination unit that determines an attenuation function which indicates a time-dependent change of the SOH specific to the battery and which is used for correcting the first residual value of the battery; and a second residual value output unit that determines and outputs a second residual value obtained by correcting the first residual value by using the attenuation function according to the period of time elapsed from the time of manufacture of the battery.

Even if the SOH (State of Health) value of the battery, which is determined on the basis of the measured values of the voltage, the current, and the temperature of the battery for which the residual value is to be determined, is the same, the rate of deterioration of the battery in the future significantly varies depending on the length of the period of time elapsed from the time the battery was manufactured to the time of measurement, resulting in a significant difference in the residual value of the battery accordingly. Therefore, in order to accurately determine the residual value of a battery, it is necessary to consider the age of the battery. e.g., the period of time elapsed from the time of manufacture thereof.

According to the battery residual value determination system in accordance with the present invention, the information on the voltage, the current, the temperature and the period of time elapsed from the time of manufacture of a battery is received by the battery information reception unit, and the first residual value indicating the SOH of the battery is determined by the first residual value determination unit on the basis of the information on the voltage, the current, and the temperature of the battery.

Further, since the attenuation function determination unit has an attenuation function indicating the time-dependent change of the SOH specific to the battery, the second residual value output unit determines and outputs a second residual value obtained by correcting the first residual value of the battery on the basis of the period of time elapsed from the time of manufacture of the battery by using the attenuation function.

This makes it possible to easily inform a user of an exact residual value of the battery, taking the age of the battery into account.

Thus, according to the battery residual value determination system in accordance with the present invention, the residual value of a battery can be easily and accurately determined.

In the battery residual value determination system in accordance with the present invention, preferably, the battery information reception unit is configured to receive information on the period of time elapsed from the time of manufacture and information indicating a service life of the battery, the attenuation function determination unit is configured to determine an attenuation coefficient by using the information on the period of time from the time of manufacture of the battery and an attenuation function determined on the basis of the information indicating the service life of the battery received by the battery information reception unit, and the second residual value output unit is configured to determine, as the second residual value, a value obtained by multiplying the first residual value by the attenuation coefficient.

The amount of future maintenance cost of a battery is an important factor in determining the residual value of the battery. In addition, if the battery fails after the service life thereof passes, the failure is not covered by manufacturer's warranty and the maintenance cost will, therefore, be borne by an owner or the like of the battery. For this reason, the period of time elapsed from the time of manufacture of the battery, for which the residual value is to be determined, and the service life of the battery are important facto, for accurately determining the residual value of the battery.

According to the battery residual value determination system in accordance with the present invention, the battery information reception unit receives the information indicating the period of time from the time of manufacture of a battery, for which the residual value is to be determined, and the information indicating the service life of the battery.

Then, the attenuation function determination unit determines an attenuation coefficient on the basis of the information on the period of time from the time of manufacture of the battery and the information indicating the service life of the battery received by the battery information reception unit, and the second residual value output unit determines, as a second residual value, a value obtained by multiplying a first residual value by the attenuation coefficient.

Consequently, when determining the residual value of a battery, the period of time elapsed from the time of manufacture and the service life of the battery are taken into account, so that the residual value of the battery can be more accurately determined.

Thus, the battery residual value determination system in accordance with the present invention makes it possible to easily and more accurately determine the residual value of a battery.

In the battery residual value determination system in accordance with the present invention, preferably, the attenuation function determination unit is configured to determine an attenuation coefficient by using expression (1) given below:

[Expression 1]

$$y = \frac{1}{1 + e^{2(x-b)}} \quad (1)$$

where "y" denotes the attenuation coefficient of the battery, "a" denotes a constant, "b" denotes a value indicating the service life of the battery, "e" denotes a Napier's constant, and "x" denotes a value indicating the period of time elapsed from the time of manufacture of the battery in terms of the number of years.

The residual value of a battery does not necessarily decrease linearly according to the period of time elapsed from the time of manufacture. The residual value slightly decreases immediately after sale, that is, at the time when the battery is out of the new condition thereof, then gradually decreases in a certain initial stage where the battery is still as good as new, and thereafter, rapidly decreases toward the end of the service life when free repair by the manufacturer thereof is no longer available.

Then, the residual value of the battery continues to rapidly decrease even after the elapse of the service life. On the other hand, however, rare metals and the like contained in the battery can be recycled even if the battery cannot be used as a battery in the end, and therefore, the residual value is not lost. Consequently, the rate of decrease in the residual value of the battery gradually decreases in the final stage of the battery life.

In other words, it is more realistic to expect a battery to change the residual value thereof along a curve to gradually decrease in the initial stage, then rapidly decrease, but continue to maintain a certain level of residual value in the final stage of the life thereof.

According to the battery residual value determination system of the present invention, the attenuation function determination unit determines the attenuation coefficient using a sigmoid function equation (1) as described above, and the second residual value output unit determines, as a second residual value, a value obtained by multiplying a first residual value by the attenuation coefficient.

Consequently, the aforesaid equation (1) is used as the attenuation function, thus making it possible to easily approximate the curve of change over time in the residual value of the battery that is closer to reality described above.

As described above, according to the battery residual value determination system in accordance with the present invention, a more realistic battery residual value can be easily determined.

BRIEF DESCRIPTION OF DRAWINGS

FIG. 1 is a block diagram illustrating an overall configuration of a battery residual value determination system;

FIG. 2 is a flowchart illustrating the details of processing by the battery residual value determination system;

FIG. 3A is a diagram illustrating an example of the content of an output of the battery residual value determination system; and FIG. 3B is a diagram illustrating another example of the content of an output of the battery residual value determination system.

DESCRIPTION OF EMBODIMENTS

With reference to the accompanying drawings, a battery residual value determination system of the present embodiment will be described. The same components may be designated by the same reference numerals and the descriptions thereof may be omitted.

First, referring to FIG. 1, the configuration of the battery residual value determination system of the present embodiment will be described. The battery residual value determination system of the present embodiment includes a user device 10 and a server 30. The user device 10 and the server 30 are connected with each other by a communication network 50 so as to be mutually communicable, thus constituting a computer network system.

The user device 10 is, for example, a computer that includes a user device control unit 110, a sensor 130, a user device output unit 150, and a user device input unit 170. The user device 10 may be a dedicated terminal used to determine the residual value of a battery, or may be a general-purpose device such as a personal computer, a smartphone, or a tablet terminal.

The user device control unit 110 is composed mainly of an arithmetic processing unit such as a CPU (Central Processing Unit), a memory, and I/O (Input/Output) devices. The user device control unit 110 reads and executes predetermined programs thereby to function as a battery information acquisition unit 111 and a display control unit 113.

The battery information acquisition unit 111 acquires, through a sensor 130, the information on the voltage, the current, the temperature and the period of time elapsed from the time of manufacture of a battery 710 of a device to be determined 70. Alternatively, the battery information acquisition unit 111 further acquires the information indicating the service life of the battery.

The display control unit 113 controls the processing for receiving a processing result of the server 30 and displaying the received processing result on a display 151 constituting the user device output unit 150.

The sensor 130 is a mechanism connected to the battery 710, for which the residual value is to be determined, through, for example, a cable Cb1, wireless communication or the like to acquire the information on the voltage, the current, the temperature and the period of time elapsed from the time of manufacture of the battery 710 of the device to be determined 70 according to instructions from the battery information acquisition unit 111. Alternatively, the sensor 130 may be configured to further acquire the information on the manufacturer's name, the type, the serial number and the like of the battery 710, for which the residual value is to be determined.

The user device output unit 150 is composed of the display 151 that performs output by displaying, for example, the processing results of the display control unit 113, and a printer 153 that performs output by printing the processing results of the display control unit 113.

The user device input units 170 are, for example, a switch, a button, a touch panel, a keyboard, and a mouse or a microphone, which accept operation inputs to the user device 10 by a user U.

The server 30 is, for example, a computer that includes a server control unit 310 and a server storage unit 330. The server 30 may be composed of a single computer or may be composed of a plurality of computers.

The server control unit 310 is composed mainly of an arithmetic processing unit such as a CPU (Central Processing Unit), a memory, and I/O (Input/Output) devices. The server control unit 310 reads and executes predetermined programs thereby to function as a battery information reception unit 311, a first residual value determination unit. 313, an attenuation function determination unit. 315, and a second residual value output unit 317.

The battery information reception unit 311 receives the information on the voltage, the current, the temperature and the period of time elapsed from the time of manufacture of the battery 710, for which the residual value is to be determined, through the user device 10. Alternatively, the battery information reception unit 311 further receives the information indicating the service life of the battery.

The first residual value determination unit 313 determines the first residual value, which indicates the SOH (State of Health) of the battery 710, on the basis of the information on the voltage, the current, and the temperature of the battery 710 received by the battery information reception unit 311.

The attenuation function determination unit 315 determines an attenuation function which indicates a time-dependent change of the SOh specific to the battery 710 and which is used to correct the first residual value of the battery 710.

The second residual value output unit 317 determines and outputs a second residual value obtained by correcting the first residual value according to the period of time elapsed from the time of manufacture of the battery 710 by using the attenuation function.

The server storage unit 330 is composed of a storage device, such as a ROM (Read Only Memory), a RAM (Random Access Memory), and an HD) (Hard Disk Drive), and stores the information used for the processing by the server control unit 310, processing results, and other necessary information.

The communication network 50 is, for example, a LAN (Local Area Network). WAN (Wide Area Network), or an Internet communication network.

The device to be determined 70 is any device provided with the battery 710, for which the residual value is to be determined, and for example, an electric vehicle or a hybrid vehicle.

<Outline of Processing by the Battery Residual Value Determination System>

Referring now to FIG. 2, a description will be given of an example of the outline of the processing by the battery residual value determination system.

First, in response to an operation by the user U, the user device 10 carries out battery information acquisition processing for acquiring the information on the voltage, the current, and the temperature of the battery 710, for which the residual value is to be determined, and the period of time elapsed from the time of manufacture of the battery 710, and for transmitting the acquired information to the server 30 (S110 of FIG. 2).

Then, the server 30 carries out battery information reception processing for receiving the information on the voltage, the current, and the temperature of the battery 710, for which the residual value is to be determined, and the period of time elapsed from the time of manufacture of the battery 710, which has been transmitted from the user device 10 (S210 of FIG. 2).

Subsequently, the server 30 carries out first residual value determination processing for determining the first residual value indicating the SOH of the battery 710 on the basis of the received information on the voltage, the current and the temperature of the battery 710 (S230 of FIG. 2), carries out attenuation function determination processing for determining the attenuation function indicating the time-dependent change of the SOH specific to the battery 710 that is used to correct the first residual value of the battery 710 (S250 of FIG. 2), and carries out second residual value output processing for determining and outputting a second residual value obtained by correcting the first residual value by using the attenuation function according the information on the period of time elapsed from the time of manufacture of the battery 710 (S270 of FIG. 2).

Thereafter, result transmission processing for transmitting the execution result of the series of processing from S210 to S270 to the user device 10 is carried out (S330 of FIG. 2).

Then, the user device 10 carries out display control processing for receiving the processing result from the server 30 and displaying the processing result on the display 151 constituting the user device output unit 150 (S510 of FIG. 2). This finishes the series of processing by the battery residual value determination system.

Referring now to FIG. 3A and FIG. 3B, the details of each processing will be described.

<Battery Information Acquisition Processing>

In response to an operation by the user U, the user device 10 is started up, connecting the sensor 130 to the battery 710, for which the residual value is to be determined, and the operation for starting the battery information acquisition processing is performed thereby to start the battery information acquisition processing.

When the battery information acquisition processing is started, the battery information acquisition unit 111 acquires, through the sensor 130, the information on the voltage, the current, and the temperature of the battery 710, for which the residual value is to be determined, and the period of time elapsed from the time of manufacture of the battery 710, or further acquires the information on the service life of the battery 710, then transmits the acquired information to the server 30, and terminates the processing.

<Battery Information Reception Processing>

The battery information reception processing is started when the server 30 receives, from the user device 10, the information on the voltage, the current, and the temperature of the battery 710, for which the residual value is to be determined, and the period of time elapsed from the time of manufacture of the battery 710. When the battery information reception processing is started, the battery information reception unit 311 stores, as necessary, the information received from the user device 10 in the server storage unit 330, and terminates the processing.

<First Residual Value Determination Processing>

The first residual value determination processing is started when the battery information reception processing is terminated in the server 30.

When the first residual value determination processing is started, the first residual value determination unit 313 determines the first residual value indicating the SOH of the battery 710 on the basis of the information on the voltage, the current, and the temperature of the battery received by the battery information reception unit 311, and terminates the processing.

Various techniques can be used as a method for the first residual value determination unit 313 to determine the first residual value indicating the SOH of the battery 710 on the basis of information on voltage, current, and temperature.

For example, the first residual value determination unit 313 is configured to determine the first residual value by calculating the SOH of the battery 710 by using a SOH calculation model or an approximate equation obtained by analyzing, using a regression analysis method or the like, the correlation between the SOH and the values of the voltage, the current and the temperature of a large number of used batteries which were manufactured and sold during the same period of time by the same manufacturer or equivalents thereto. Alternatively, for example, the first residual value determination unit 313 may be configured to determine the SOH of the battery 710 by using an Ai that has learned the values of the voltage, the current and the temperature and the SOH of a large number of used batteries.

<Attenuation Function Determination Processing>

The attenuation function determination processing is started in the server 30 upon the completion of the first residual value determination processing.

When the attenuation function determination processing is started, the attenuation function determination unit 315 determines an attenuation function which indicates the time-dependent change of the SOH specific to the battery 710 and which is used to correct the first residual value of the battery 710. Alternatively, the attenuation function determination unit 315 further determines an attenuation coefficient by using the attenuation function.

The attenuation function determined by the attenuation function determination unit 315 at this time may be, for example, a linear equation or a multi-order equation that uses information on the period of time elapsed from the time of manufacture of the battery 710 as a variable, or a function that uses other additional variables, as long as the function indicates the time-dependent change of the SOH specific to the battery 710, or various methods may be used, such as a model or approximate equation that analyzes the correlation between the period of time elapsed from the time of manufacture of the battery 710 and the SOH. In the present embodiment, the attenuation function is represented by, for example, a sigmoid function equation given below.

[Expression 1]

$$y = \frac{1}{1+e^{a(x-b)}} \quad (1)$$

where "y" denotes the attenuation coefficient of the battery 710, "a" denotes a constant, "b" denotes a value indicating the service life of the battery 710, "e" denotes a Napier's constant, and "x" denotes a value indicating the period of time elapsed from the time of manufacture of the battery 710 in terms of the number of years.

The attenuation function determination unit 315 determines the attenuation function according to, for example, the aforesaid expression on the basis of the information on the period of time elapsed from the time of manufacture of the battery and the information indicating the service life of the battery received by the battery information reception unit, and then determines the attenuation coefficient by using the determined attenuation function.

More specifically, the attenuation function determination unit 315 acquires the constant "a" stored beforehand in, for example, the server storage unit 330 by referring to the server storage unit 330, and determines the attenuation function by using the acquired constant "a", the value indicating the service life of the battery 710 included in the information received by the battery information reception unit 311 from the user device 10, and the value obtained by converting the information indicating the period of time elapsed from the time of manufacture of the battery 710, which is included in the information received by the battery information reception unit 311 from the user device 10, into the number of years.

Then, the attenuation function determination unit. 315 determines the attenuation coefficient "y" by using the aforesaid expression (1), and terminates the processing.

Consequently, the period of time elapsed from the time of manufacture and the service life of the battery 710 are taken into account when determining the residual value of the battery 710, thus making it possible to determine the residual value of the battery 710 more accurately.

Further, the aforesaid expression (1) is used as the attenuation function, so that it is possible to easily approximate the curve of the time-dependent change in the residual value of the battery that is closer to reality.

<Second Residual Value Output Processing>

The second residual value output processing is started in the server 30 upon completion of the attenuation function determination processing.

When the second residual value output processing is started, the second residual value output unit 317 determines and outputs, as the second residual value of the battery 710, the value obtained by multiplying the first residual value of the battery 710 determined by the first residual value determination processing by the attenuation coefficient "y" determined by the attenuation function determination processing, and terminates the processing.

Consequently, the user U can easily know an exact residual value of the battery 710 that takes the age of the battery 710 into account.

Alternatively, the second residual value output unit 317 may be configured to also output information giving a graph that indicates the second residual value of the battery 710.

<Result Transmission Processing>

The result transmission processing is started in the server 30 upon completion of the second residual value output processing.

When the result transmission processing is started, a result transmission unit 321 transmits, to the user device 10, the information which is output by the second residual value output processing and which indicates the second residual value of the battery 710, for which the residual value is to be determined, together with, for example, the information which indicates the first residual value of the battery 710, for which the residual value is to be determined, and terminates the processing.

Alternatively, in the case where the second residual value output unit 317 is configured to also output the information including a graph indicating the second residual value of the battery 710, the information including the graph is transmitted together with the aforesaid information to the user device 10.

<Display Control Processing>

The display control processing is started when the user device 10 receives the information indicating the second residual value of the battery 710, for which the residual value is to be determined, from the server 30.

When the display control processing is started, the display control unit 113 displays, on the display 151 as illustrated in FIG. 3A, the information including the information indicating the second residual value of the battery 710, for which the residual value is to be determined, received from the server 30, and terminates the processing.

FIG. 3A is a graph Gra1 in which the vertical axis represents the first residual value of the battery 710, for which the residual value is to be determined, in units of percentage, and the horizontal axis represents the period of time elapsed from the time of manufacture of the battery 710 (hereinafter referred to as the elapsed period of time) expressed in units of year.

The graph Gra1 illustrates a case where the constant "a" in the aforesaid expression (1) is 0.4, the value "b" indicating the service life of the battery 710 is 10 (years), the length of time the battery 710 has been used at the time of processing is 2 (years), and the first residual value of the battery 710 determined by the first residual value determination processing is 0.9500.

Further, the graph Gra1 includes boundary lines Lin1, Lin2 . . . Lin19 as the indication of the boundaries of residual value ranks, which are divided into ranks of 100% to 95%, below 95% to 90% and so on in 5% increments according to the second residual value of the battery 710.

For example, the boundary line Lin1 indicates the boundary of what percentage of the first residual value must be greater than or equal to in each elapsed period of time in order for a value resulting from the correction of the first residual value of battery 710 to the second residual value to have a residual value rank of 100% to 95%.

More specifically, if the elapsed period of time is one year, then the first residual value at the boundary of the boundary line Lin1 is 92.46%. This value is obtained by multiplying "95%" by an attenuation coefficient (0.9734) in the case where the elapsed period of time is one year.

Similarly, the first residual value at the boundary of the boundary line Lin1 in each case where the elapsed period of time is two years or more is calculated by the server 30, and the boundary line Lin1 connecting the value in each elapsed period of time is included in the graph Gra1.

The boundary lines Lin2 . . . Lin19, which are the results calculated by the same method are included in the graph Gra1 as the indication of the boundaries of the residual value ranks.

Further, the graph Gra1 includes an indication Val1 denoting the first residual value of the battery 710, for which the residual value is to be determined. In the present embodiment, the indication Val1 indicates that the elapsed period of time is two years, and the first residual value denoted in units of percentage is 95%.

Further, the graph Gra1 includes indications Grp1, Grp2, and Grp3 that denote the boundaries of three groups obtained by grouping the residual value ranks according to the magnitude of the second residual value, the groups each indicating the type of application for which the battery 710, for which the residual value is to be determined, can be used.

In the present embodiment, the indication Grp1 indicates the range included in a first group indicating that a battery can continue to be used for a current application. This range includes the battery 710 with the second residual value of 75% or more.

Further, the indication Grp2 indicates the range included in a second group indicating that a battery cannot be used for a current application but can be used for other applications. This range includes the battery 710 with the second residual value of below 75% to 30% or more.

Further, the indication Grp3 indicates the range included in a third group indicating that a battery cannot be used for a current application and for any other applications. This range includes the battery 710 with the second residual value of below 30%.

In addition, the graph Gra1 includes an indication Est indicating the estimated values of the first residual value of the battery 710, for which the residual value is to be determined, at a plurality of points in the future.

Further, the graph Gra1 may include an indication Val2 indicating the second residual value of the battery 710 at the time of processing, as illustrated in FIG. 3A.

In addition, FIG. 3B illustrates the contents of a graph Gra2 in the case where the attenuation function determination unit 315 is configured to determine the attenuation coefficient by using, as the attenuation function, a linear equation (2) given below in place of the aforesaid expression (1).

$$y = 1 - x \cdot (1-d)/c \qquad (2)$$

where "y" denotes the attenuation coefficient of a battery, "c" denotes a value indicating the longest period of time of use of the battery in terms of the number of years, "d" denotes a value indicating the residual rate of the first residual value after the elapse of the longest period of time of use of the battery, and "x" denotes a value indicating the period of time elapsed from the time of manufacture of the battery. In FIG. 3B, the calculation is performed by setting "c" to 20 (years) and "d" to 30%.

As described above, according to the present invention, a battery residual value determination system capable of easily and accurately determining the residual value of a battery can be provided.

Although the embodiments of the present invention have been described above, the present invention is not limited thereto. Various modifications can be made without departing from the spirit of the present invention.

For example, the above has described the configuration provided with the user device 10 and the server 30, but the present invention is not limited thereto. For example, the user device 10 may be provided with all functions of the aforesaid server 30. In this case, the server 30 is omitted.

Alternatively, for example, the above has described the configuration in which the battery information acquisition unit 111 acquires, through the sensor 130, the information on the period of time elapsed from the time of manufacture of the battery 710 of the device to be determined 70, however, the present invention is not limited thereto. For example, a configuration may be adopted, in which the battery information acquisition unit 111 acquires, through the sensor 130, information that specifies the time of manufacture of the battery 710, such as the manufacturer's name, the type, and the serial number of the battery 710 and transmits the acquired information to the server 30, and the battery information reception unit 311 of the server 30 refers to a table of correspondence between the information for identifying the time of manufacture of the battery 710 stored in the server storage unit 330 in advance and the information indicating the time of manufacture of the battery 710 thereby to acquire the information on the period of time elapsed from the time of manufacture of the battery 710.

Further, the above has described the case where the display control unit 113 is configured to display the second residual value of the battery at the time of processing in the graphs in units of percentage; however, the present invention is not limited thereto.

For example, the display control unit 113 may be configured to display, in a graph, a letter (e.g., a rank A in the case of 100% to 95%) or a number (e.g., 4 in the case of below 95% to 90% or more on a five-point scale) or other symbols representing ranks corresponding to the second residual values, in addition to or in place of displaying the second residual values in units of percentage.

DESCRIPTION OF REFERENCE NUMERALS

10 . . . user device; 111 . . . battery information acquisition unit; 113 . . . display control unit; 130 . . . sensor; 150 . . . user device output unit; 30 . . . server; 311 . . . battery information reception unit; 313 . . . first residual value determination unit; 315 . . . attenuation function determination unit; 317 . . . second residual value output unit; and 710 . . . battery.

The invention claimed is:

1. A battery residual value determination system comprising:
a battery information reception unit that receives information on a voltage, a current, a temperature, and a period of time elapsed from a time of manufacture of a battery for which a residual value is to be determined;
a first residual value determination unit that determines a first residual value indicating a SOH (State of Health) of the battery based on the information on the voltage, the current, and the temperature of the battery received by the battery information reception unit;
an attenuation function determination unit that determines an attenuation function which indicates a time-dependent change of the SOH specific to the battery and which is used for correcting the first residual value of the battery; and
a second residual value output unit that determines and outputs a second residual value obtained by correcting the first residual value by using the attenuation function according to the period of time elapsed from the time of manufacture of the battery,
wherein:
the battery information reception unit is configured to receive information on the period of time elapsed from the time of manufacture and information indicating a service life of the battery,
the attenuation function determination unit is configured to determine an attenuation coefficient by using an attenuation function determined based on the information on the period of time elapsed from the time of manufacture of the battery and the information indicating the service life of the battery received by the battery information reception unit,
the second residual value output unit is configured to determine, as the second residual value, a value obtained by multiplying the first residual value by the attenuation coefficient, and
the attenuation function determination unit is configured to determine the attenuation coefficient by using expression (1) given below:

[Expression 1]

$$y = \frac{1}{1 + e^{a(x-b)}} \quad (1)$$

where "y" denotes the attenuation coefficient of the battery, "a" denotes a constant, "b" denotes a value indicating the service life of the battery, "e" denotes Napier's constant, and "x" denotes a value indicating the period of time elapsed from the time of manufacture of the battery in terms of a number of years.

2. A battery residual value determination method carried out by a computer, the method comprising:
a battery information reception step of receiving information on a voltage, a current, a temperature, and a period of time elapsed from a time of manufacture of a battery for which a residual value is to be determined,
a first residual value determination step of determining a first residual value indicating a SOH (State of Health) of the battery based on the information on the voltage, the current, and the temperature of the battery received in the battery information reception step;
an attenuation function determination step of determining an attenuation function which indicates a time-dependent change of the SOH specific to the battery and which is used for correcting the first residual value of the battery; and
a second residual value output step of determining and outputting a second residual value obtained by correcting the first residual value by using the attenuation function according to the period of time elapsed from the time of manufacture of the battery,
wherein:
the battery information reception step comprises receiving information on the period of time elapsed from the time of manufacture and information indicating a service life of the battery,
the attenuation function determination step comprises determining an attenuation coefficient by using an attenuation function determined based on the information on the period of time elapsed from the time of manufacture of the battery and the information indicating the service life of the battery received by the battery information reception unit,
the second residual value output step comprises determining, as the second residual value, a value obtained by multiplying the first residual value by the attenuation coefficient, and the attenuation function determination step comprises determining the attenuation coefficient by using expression (1) given below:

[Expression 1]

$$y = 1/1 + e^{a(x-b)} \qquad (1)$$

where "y" denotes the attenuation coefficient of the battery, "a" denotes a constant, "b" denotes a value indicating the service life of the battery, "e" denotes Napier's constant, and "x" denotes a value indicating the period of time elapsed from the time of manufacture of the battery in terms of a number of years.

\* \* \* \* \*